United States Patent
Ehiasarian et al.

(10) Patent No.: US 7,081,186 B2
(45) Date of Patent: Jul. 25, 2006

(54) COMBINED COATING PROCESS COMPRISING MAGNETIC FIELD-ASSISTED, HIGH POWER, PULSED CATHODE SPUTTERING AND AN UNBALANCED MAGNETRON

(75) Inventors: Arutiun Papken Ehiasarian, Sheffield (GB); Papken Ehiasar Hovsepian, Sheffield (GB); Wolf-Dieter Munz, Vienna (AT)

(73) Assignee: Sheffield Hallam University (GB)

( * ) Notice: Subject to any disclaimer, the term of this patent is extended or adjusted under 35 U.S.C. 154(b) by 190 days.

(21) Appl. No.: 10/718,435

(22) Filed: Nov. 20, 2003

(65) Prior Publication Data

US 2005/0109607 A1    May 26, 2005

(51) Int. Cl.
    *C23C 14/35* (2006.01)
(52) U.S. Cl. .......................... 204/192.12; 204/192.15; 204/192.16; 204/192.3
(58) Field of Classification Search ........... 204/192.12, 204/192.15, 192.16, 192.3
    See application file for complete search history.

(56) References Cited

U.S. PATENT DOCUMENTS

| | | | |
|---|---|---|---|
| 5,306,407 A | 4/1994 | Hauzer et al. | 204/192.38 |
| 6,033,734 A | 3/2000 | Muenz et al. | 427/309 |
| 6,296,742 B1 | 10/2001 | Kouznetsov | 204/192.12 |

FOREIGN PATENT DOCUMENTS

| | | |
|---|---|---|
| DE | 10124749 | 11/2002 |
| EP | 1260603 | 11/2002 |

OTHER PUBLICATIONS

Munz, W.-D., "Nouvelles tendances en procedes magnetron et arc", Le Vide, No. 297, vol. 3/4, 2000, p. 205-223.
Munz, W.-D., "Wear Resistant PVD Coatings for High Temperature (950° C) Applications", Annual Conference, Chicago, Apr. 17-22, 1999, p. 350-356.
Schonjahn, C., Donahue, L.A., Lewis, D.B., and Munz, W.-D., "Enhanced adhesion through local epitaxy of transition-metal nitride coatings on ferritic steel promoted by metal ion etching in a combined cathodic arc/unbalanced magnetron deposition system", Journal of Vacuum Science and Technology, vol. 18, Issue 4, 2000, p. 1718-1723.

(Continued)

*Primary Examiner*—Rodney G. McDonald
(74) *Attorney, Agent, or Firm*—Trexler, Bushnell, Giangiorgi, Blackstone & Marr, Ltd

(57) ABSTRACT

A PVD process for coating substrates, wherein the substrate is pre-treated in the vapor of a pulsed, magnetic field-assisted cathode sputtering operation, and during pre-treatment a magnetic field arrangement of the magnetron cathode type, with a strength of the horizontal component in front of the target of 100 to 1500 Gauss, is used for magnetic field-assistance, and after pre-treatment further coating is effected by means of cathode sputtering and the power density of the pulsed discharge during pre-treatment is greater than 1000 W.cm$^{-2}$.

22 Claims, 2 Drawing Sheets

OTHER PUBLICATIONS

Munz, W.-D., Smith, I.J., Lewis, D.B., and Creasy, S., "Droplet formation on steel substrates during cathodic steered arc metal ion etching", Vacuum, vol. 48, Issue 5, 1997, p. 473-481.

Wang, H.W., Stack, M.M., Lyon, S.B., Hovsepian, P., and Munz, W.-D., "The corrosion behaviour of macroparticle defects in arc bond-sputtered CrN/NbN superlattice coatings", Surface and Coatings Technology, vol. 126, 2000, p. 279-287.

Ehiasarian, A.P., New., R., Munz, W.-D., Hultman, L., Helmersson, U., and Kouznetsov, V., "Influence of high power densities on the composition of pulsed magnetron plasmas", Vacuum, vol. 65, 2002, p. 147-154.

Figure 1. Comparison of the optical emission of plasmas created by High Power Pulsed Sputtering and Continuous Sputtering at average power 100 W

COMBINED COATING PROCESS COMPRISING MAGNETIC FIELD-ASSISTED, HIGH POWER, PULSED CATHODE SPUTTERING AND AN UNBALANCED MAGNETRON

FIELD OF THE INVENTION

This invention relates to PVD coating processes incorporating magnetic field assisted, high-power, pulsed cathode sputtering together with an unbalanced magnetron.

BACKGROUND TO THE INVENTION

The combination of a cathodic arc discharge and an unbalanced magnetron for the coating of tools and components which are subjected to severe wear is disclosed in U.S. Pat. No. 5,306,407 Hauzer et al, and in W.-D. Münz, C. Schöhnjahn, H. Paritong, I. J. Smith, Le Vide, No, 297, Vol. 3/4, 2000, p. 205–223 and has proved to be very successful when employed industrially (see W.-D. Münz, I. J. Smith, SVC, 42 Ann. Tech. Conf. Proc., Chicago, Ill., Apr. 17–22, 1999, p. 350–356)

The multiply-ionised metal ions which are produced in the vapour of the cathodic arc discharge are used for low-energy ion implantation; typical acceleration voltage at the substrate: 1.2 kV, in order to produce ideal conditions for excellent layer bonding. In special cases, localised, epitaxial layer growth can even be achieved (see C. Schöhnjahn, L, A. Donohue, D. B. Lewis, W.-D. Münz, R. D. Twesten, I, Petrov, Journal of Vacuum Science and Technology, Vol. 18, Iss. 4. 2000, p. 1718–1723).

Bombarding the substrate surface with Cr ions has proved to be particularly successful as described in U.S. Pat. No. 6,033,734 Münz et al, since firstly excellent bonding strengths are achieved and secondly the macro-particles ("droplets") which are formed as an unwanted by-product have proved to be small compared with the macro-particles which are formed during cathodic arc discharge from materials with a lower melting point, e.g. Ti or TiAl (see W.-D. Münz, I. J. Smith, D. B. Lewis, S. Creasy, Vacuum, Vol. 48, Issue. 5, 1997, p, 473–481).

Whereas in many applications of tool coating these macro-particles, which develop into considerably enlarged growth defects during coating with an unbalanced magnetron, are only of secondary importance, they become considerably more important in anti-corrosion applications (see H. W. Wang, M. M. Stark, S. B. Lyon, P. Hovsepian, W.-D. Münz. Surf, Coat. Technol., 126, 2000, p. 279–287) or during the dry machining of hardened steels (HRC-60), for example, where layer roughness and porosity play a significant part.

With regard to the processes used in the field of industrial PVD coating, it has hitherto only been practicable to produce high metal ion densities by means of a cathodic arc discharge. On the other hand, the importance of magnetic-field assisted pulsed cathode sputtering is increasing appreciably.

By using power densities higher than 1000 W.cm$^{-2}$, it is possible to produce metal vapours in which up to 60% of the metal atoms are ionised (see A. P. Ehiasarian, R. New, K. M. Macak, W.-D. Münz, L Hultman U. Helmersson, V. Kouznetsov, Vacuum, 65 (2202), p 147. This value is comparable with the degrees of ionisation of metal vapours achieved in a cathodic arc discharge.

SUMMARY OF THE INVENTION

According to the invention, the cathodic arc discharge constituent is replaced as an element of the ABS technique by a magnetic field-assisted, high-power, pulsed cathode sputtering source. The processes which occur on the substrate during pre-treatment remain unchanged. The negative acceleration voltages which are necessary for achieving etching effects and ion implantation remain unchanged, and typically range between −0.5 and −1.5 kV. During the treatment of tool steels or hard metals with Cr ions, the acceleration voltage (negative bias voltage) remains unchanged at −1.2 kV [4]. The subsequent coating operation using an unbalanced magnetron in non-pulsed operation also remains unchanged, since conventional power supplies offer the advantages of a more efficient energy yield and lower equipment costs.

Figure 1:
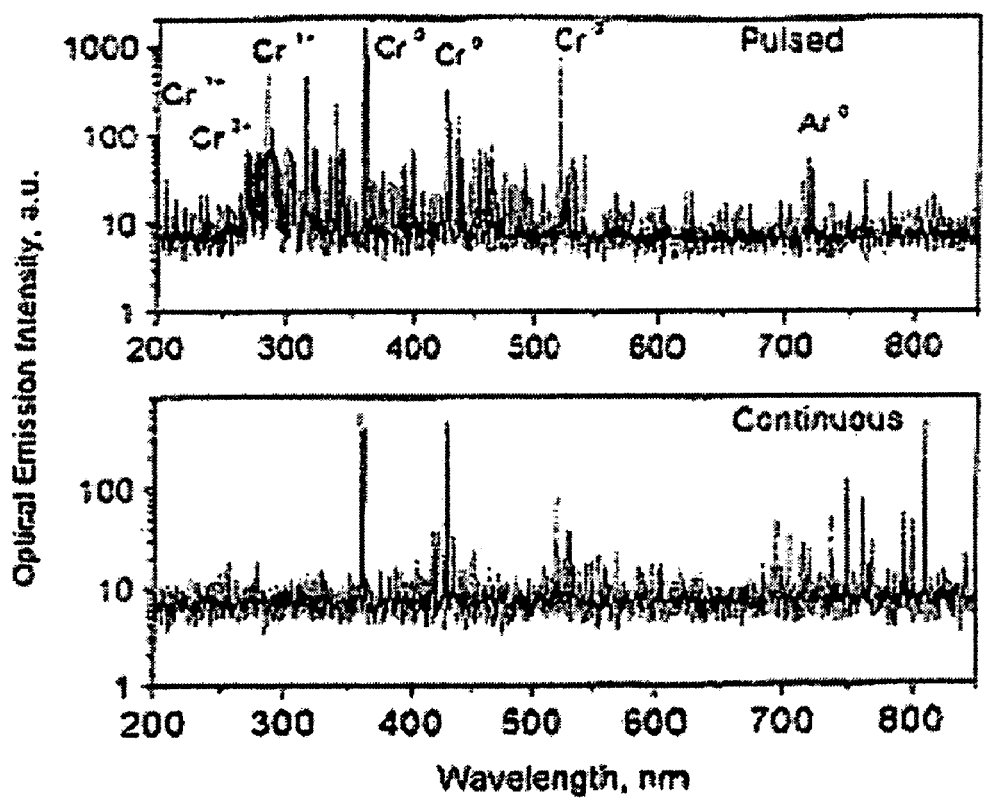
FIG. 1 shows an optical emission spectrum of a plasma produced in a pulsed discharge of this type, using Cr as the target, and with a power density of 3000 W.cm$^{-2}$, a peak voltage of −1200 V, a pulse duration of 50 µs and a pulse interval of 20 ms. The crucial advantage of this type of metal ion production is that no macro-particles ("droplets") are produced, and the formation of growth defects as a consequence of nucleation on macro-particles is prevented.
Figure 2:
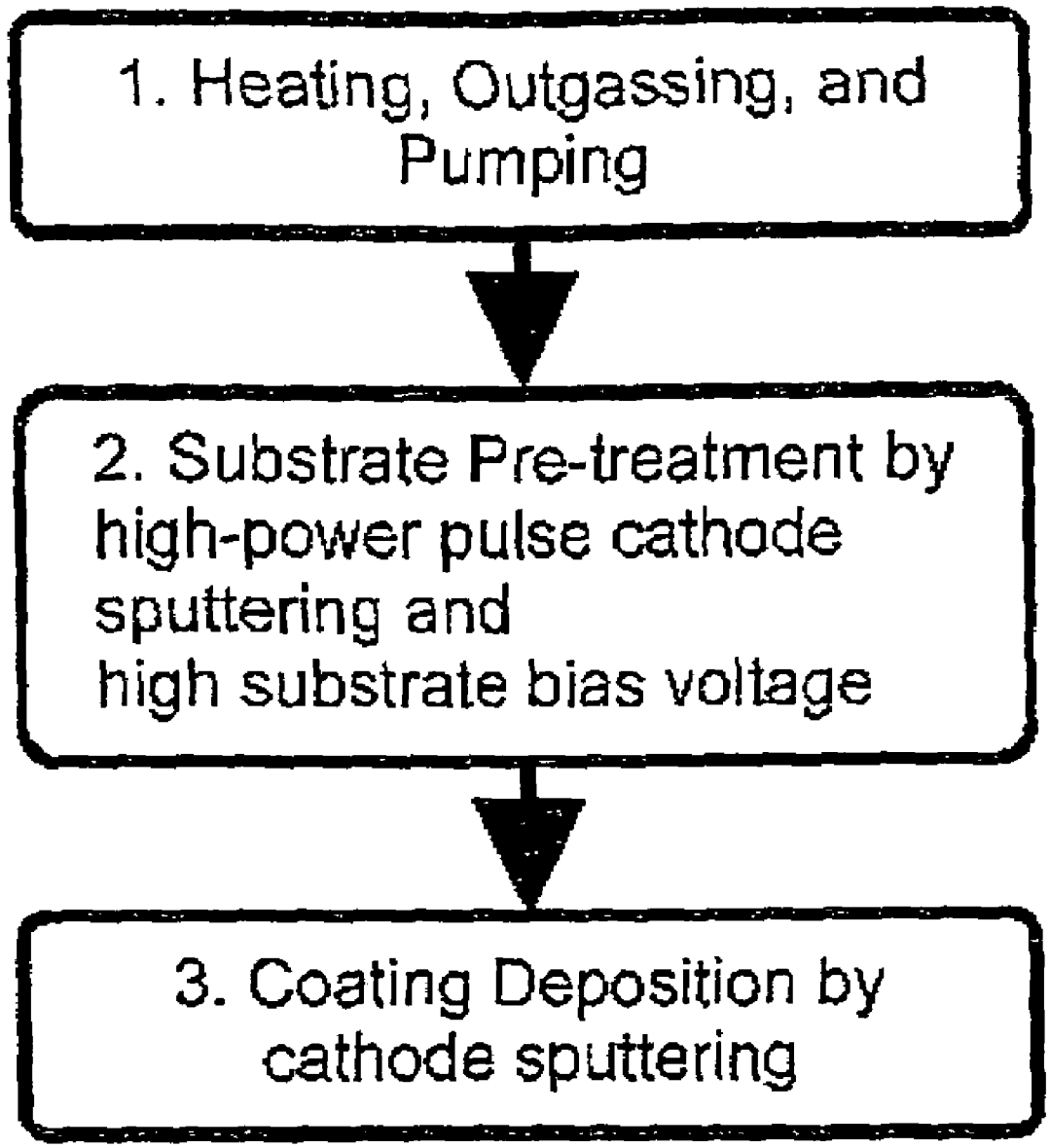
FIG. 2 is a block diagram of a method which is in accordance with an embodiment of the present invention.

Specifically, as shown in FIG. 2, an embodiment of the present invention provides a PVD process for coating substrates, wherein the substrate is pre-treated in the vapour of a pulsed, magnetic field-assisted cathode sputtering operation, and during pre-treatment a magnetic field arrangement of a magnetron cathode, with a strength of the horizontal component in front of the target of 100 to 1500 Gauss, is used for magnetic field-assistance, and wherein after pre-treatment further coating is effected by means of cathode sputtering, with the power density of the pulsed discharge during pre-treatment being greater than 1000 W.cm$^{-2}$.

Preferably, the power density falls within the range from 2000 to 3000 W.cm$^{-2}$. Preferably, the pulse duration (on-time) ranges between 10 and 1000 µs, and the pulse interval (repetition period) is between 0.2 ms and 1000 s. Preferably, the pulse duration is 50 µs, and the pulse interval is 20 ms. Preferably, magnetron discharge is distributed over a cathode surface area and occupies at least 50% of the surface area. Preferably, the discharge is distributed over 70–90% of a cathode surface area. Preferably, an average pulsed discharge current density is less than 10 A.cm$^{-2}$. Preferably, the localised maximum pulsed discharge current density is less than 100 A.cm$^{-2}$. Preferably, pulses which are generated have a peak voltage from 0.5 to 2.5 kV. Preferably, pre-treatment with a magnetic field-assisted cathode sputtering is conducted in a non-reactive atmosphere, selected from a group consisting of Ne, Ar, Kr and Xe, with targets which included material selected from a group consisting of Cr, V. Ti, Zr, Mo, W, Nb and Ta. Preferably, pre-treatment is effected with Ar in the pressure range from 10$^{-5}$ to 10$^{-1}$ mbar. Preferably, pre-treatment is effected with Ar at a pressure of 10$^{-3}$ mbar. Preferably, during pre-treatment a negative bias voltage within the range from 0.5 to 1.5 kV is applied to the substrates, so that an etching or cleaning process is initiated simultaneously with an ion implantation process (ABS technique). Preferably, the negative bias voltage is pulsed with pulse widths of 2 µs to 20 ms and a pulse interval which is likewise 2 μs to 20 ms. Preferably, the coating formed by cathode sputtering consists of the nitrides TiN, ZrN, TiAlN, TiZrN, TiWN, TiNbN, TiTaN, TiBN or the carbonitrides TiCN, ZrCN, TiAlCN, TiZrCN, TiVCN, TiNbCN, TiTaCN or TiBCN. Preferably, the coating contains 0.1 to 5 atomic % of an element selected from the group of Sc, Y, La and Ce. Preferably, the coatings consist of nanometre-scale multi-layer coatings with a periodicity of 1 to 10 nm, from the group comprising TiN/TiAlN, TiN/VN, TiN/NbN, TiN/TaN, TiN/ZrN, TiAlN/CrN, TiAlN/ZrN, TiAlN/VN, CrN/NbN, CrN/TaN, CrN/TiN, Cr/C, Ti/C, Zr/C, V/C, Nb/C or Ta/C. Preferably, one of the cited individual layers contains 0.1 to 5 atomic % of an element selected from the group of Sc, Y, La and Ce. Preferably, both of the cited individual layers contain 0.1 to 5 atomic % of an element selected from the group of Sc, Y, La and Ce. Preferably, the cathode sputtering employed during coating is unbalanced magnetron sputtering. Preferably, identical cathodes and identical magnetic field arrangements are used for pre-treatment and coating. Preferably, specific adaptations of the magnetic field strength are made, by adjusting the distance of a magnet array from a target surface, in order to optimise the pre-treatment and coating operations.

A series of publications already exists which relate to pulsed power supplies for operating cathode sputtering sources. A typical arrangement is described in U.S. Pat. No. 6,296,742 of Vladimir. Kouznetsov. However, this source has been exclusively developed for the coating of substrates, and not for the pre-treatment of substrates.

The invention claimed is:

1. A PVD process for coating substrates, wherein the substrate is pre-treated in the vapour of a pulsed, magnetic field-assisted cathode sputtering operation, and during pre-treatment a magnetic field arrangement of a magnetron cathode, with a strength of the horizontal component in front of a target of 100 to 1500 Gauss, is used for magnetic field-assistance, and wherein after pre-treatment further coating is effected by means of cathode sputtering, with a power density of the pulse, magnetic field assisted cathode sputtering operation, during pre-treatment being greater than 1000 W.cm$^{-2}$.

2. A process in accordance with claim 1 wherein the power density falls within the range from 2000 to 3000 W.cm$^{-2}$.

3. A process in accordance with claim 1 wherein a pulse duration (on-time) ranges between 10 and 1000 μs, and that the pulse interval (repetition period) is between 0.2 ms and 1000 s.

4. A process in accordance with claim 1 wherein a pulse duration is 50 μs and a pulse interval is 20 ms.

5. A process in accordance with claim 1 wherein magnetron discharge is distributed over a cathode surface area and occupies at least 50% of the surface area.

6. A process in accordance with claim 5 wherein the discharge is distributed over 70–90% of the cathode surface area.

7. A process in accordance with claim 1 wherein an average pulsed discharge current density is less than 10 A.cm$^{-2}$.

8. A process in accordance with claim 1 wherein a localised maximum pulsed discharge current density is less than 100 A.cm$^{-2}$.

9. A process in accordance with claim 1 wherein pulses which are generated have a peak voltage from 0.5 to 2.5 kV.

10. A process in accordance with claim 1 wherein pre-treatment with the magnetic field-assisted cathode sputtering operation is conducted in a non-reactive atmosphere, selected from a group consisting of Ne, Ar, Kr and Xe, with targets which includes material selected from a group consisting of Cr, V, Ti, Zr, Mo, W, Nb and Ta.

11. A process in accordance with claim 1 wherein pre-treatment is effected with Ar in the pressure range from $10^{-5}$ to $10^{-1}$ mbar.

12. A process in accordance with claim 1 wherein pre-treatment is effected with Ar at a pressure of $10^{-3}$ mbar.

13. A process in accordance with claim 1 wherein during pre-treatment a negative bias voltage within the range from 0.5 to 1.5 kV is applied to the substrates, so that an etching or cleaning process is initiated simultaneously with an ion implantation process (ABS technique).

14. A process in accordance with claim 13 wherein the negative bias voltage is pulsed with pulse widths of 2 μs to 20 ms and a pulse interval which is likewise 2 μs to 20 ms.

15. A process in accordance with claim 1 wherein the coating formed by cathode sputtering consists of the nitrides TiN, ZrN, TiAlN, TiZrN, TiWN, TiNbN, TiTaN, TiBN or the carbonitrides TiCN, ZrCN, TiAlCN, TiZrCN, TiVCN, TiNbCN, TiTaCN or TiBCN.

16. A process in accordance with claim 1 wherein the coating contains 0.1 to 5 atomic % of an element selected from the group of Sc, Y, La and Ce.

17. A process in accordance with claim 1 wherein the coating consists of nanometer-scale multi-layer coatings with a periodicity of 1 to 10 nm, from the group comprising TiN/TiAlN, TiN/VN, TiN/NbN, TiN/TaN, TiN/ZrN, TiAlN/CrN, TiAlN/ZrN, TiAlN/Vn, CrN/NbN, CrN/Tan, CrN/TiN, Cr/C, Ti/C, Zr/C, V/C, Nb/C or Ta/C.

18. A process in accordance with claim 17 wherein one of the cited individual layers contains 0.1 to 5 atomic % of an element selected from the group of Sc, Y, La and Ce.

19. A process in accordance with claim 17 wherein both of the cited individual layers contain 0.1 to 5 atomic % of an element selected from the group of Sc, Y, La and Ce.

20. A process in accordance with claim 1 wherein the cathode sputtering employed during coating is unbalanced magnetron sputtering.

21. A process in accordance with claim 1 wherein identical cathodes and identical magnetic field arrangements are used for pre-treatment and coating.

22. A process in accordance with claim 21 wherein specific adaptations of a magnetic field strength are made, by adjusting the distance of a magnet array from a target surface, in order to optimise the pre-treatment and coating operations.

* * * * *